United States Patent [19]
Seyyedy

[11] Patent Number: 5,818,777
[45] Date of Patent: Oct. 6, 1998

[54] CIRCUIT FOR IMPLEMENTING AND METHOD FOR INITIATING A SELF-REFRESH MODE

[75] Inventor: Mirmajid Seyyedy, Boise, Id.

[73] Assignee: Micron Technology, Inc., Boise, Id.

[21] Appl. No.: 812,573

[22] Filed: Mar. 7, 1997

[51] Int. Cl.$^6$ .................................................. G11C 8/00
[52] U.S. Cl. .............. 365/222; 365/230.03; 365/230.06; 365/230.08; 365/236
[58] Field of Search .............................. 365/222, 230.03, 365/230.06, 230.08, 236, 189.05

[56] References Cited

U.S. PATENT DOCUMENTS

| | | | |
|---|---|---|---|
| 5,450,364 | 9/1995 | Stephens, Jr. et al. ................. | 365/222 |
| 5,471,430 | 11/1995 | Sawada et al. .......................... | 365/222 |
| 5,627,791 | 5/1997 | Wright et al. ........................... | 365/222 |
| 5,636,173 | 6/1997 | Schaefer .................................. | 365/222 |

*Primary Examiner*—David C. Nelms
*Assistant Examiner*—Trong Phan
*Attorney, Agent, or Firm*—Seed and Berry LLP

[57] ABSTRACT

A memory device includes address, data, and command busses, a bank of memory cells arranged in rows, an address decoder coupled to the address bus and memory bank, a read/write circuit coupled to the address decoder and memory bank, a data input/output circuit coupled to the data bus and read/write circuit, and a control circuit coupled to the command bus, address decoder, read/write circuit, and data input/output circuit. The control circuit implements a self refresh of the memory bank when it receives on the command bus a clock signal having clock edges, a refresh command at a first clock edge, and a column command at a second clock edge that occurs a predetermined number of clock edges after the first clock edge. The predetermined number is small enough so that previous versions of the memory device do not interpret the column command as a separate instruction.

51 Claims, 5 Drawing Sheets

CIRCUIT FOR IMPLEMENTING AND METHOD FOR INITIATING A SELF-REFRESH MODE

TECHNICAL FIELD

The present invention relates generally to memory devices, and more particularly to a memory circuit that can automatically refresh the contents of its memory cells and to a method for initiating such a refresh mode.

BACKGROUND OF THE INVENTION

Because of today's rapidly advancing technology, a new version of an integrated circuit may be introduced before the older versions become obsolete. In addition to performing the same functions faster than the older versions, the new version may also be able to perform other functions that the older versions cannot. To implement these other functions, the new version often has an expanded number of commands that it accepts as compared to the older versions.

Because engineers may design electronic systems that use both the new version of the circuit as well as one or more of the older versions, the new version should be "backwards compatible" with the older versions. That is, any new commands accepted by the new version should not cause the older version to operate improperly. FIGS. 1 and 2 illustrate an example of this scenario for memory devices.

FIG. 1 is a timing diagram of a conventional auto-refresh instruction for a dynamic random access memory (DRAM). The auto refresh instruction includes a refresh command, which includes the signals chip select ($\overline{CS}$), row-address strobe ($\overline{RAS}$), and column-address strobe ($\overline{CAS}$) all equal to logic 0 at a rising edge of the CLOCK signal, and which includes the signal write enable ($\overline{WE}$) equal to logic 1 at the clock edge. The auto refresh instruction also includes the signal clock enable ($\overline{CKE}$), which equals logic 1 at the clock edge. One device that will respond to this instruction is an MT41LC256K32D4(S) 256K×32 SGRAM, manufactured by Micron Technology, Inc. of Boise, Id., and described in Micron's 1995 DRAM Data Book.

This auto-refresh instruction, which is sometimes referred to as a $\overline{CAS}$-before-$\overline{RAS}$ (CBR) instruction, instructs a memory device to refresh one row of memory cells. Typically, the memory device includes an internal refresh counter that keeps track of the row in need of refreshing; therefore, the memory device does not require an externally supplied address for refresh purposes. As long as the auto-refresh instruction is repeated for each row of the memory device within a time period that is sufficiently short, the data stored in the memory cells is refreshed before it becomes corrupted. For example, in the MT41, a distributed auto refresh, i.e., periodically issuing an auto-refresh instruction in between other instructions, must be performed at most every 16.6 microseconds. Alternatively, a burst auto refresh, i.e., issuing all 1,024 auto-refresh instructions consecutively, must be performed every 17 milliseconds, with the interval between consecutive auto-refresh instructions being a specified minimum value.

FIG. 2 is a timing diagram of a conventional self-refresh instruction that is compatible with the MT41. The self-refresh instruction includes the same refresh command as the auto-refresh instruction of FIG. 1. But for the self-refresh instruction, CKE equals a different logic level, here logic 0. Thus, the only difference between the auto-refresh and the self-refresh instructions is the logic level of CKE.

The self-refresh instruction causes the memory device to internally execute a continuous refresh of its storage cells without further external instructions. Thus, the self-refresh mode is particularly useful in systems that have a sleep mode. The memory device remains in self-refresh mode until the system transitions CKE to a logic 1. The system then issues a series of no-operation (NOP) instructions for a time period sufficient to allow the memory device to complete the current self-refresh cycle before performing other tasks.

A problem with the instruction scheme of FIGS. 1 and 2 is that CKE often must adhere to strict time setup and hold rules. Thus, the system CKE driver (not shown in FIGS. 1 and 2) often must be relatively fast and accurate. Because such a driver typically occupies a relatively large area of the memory device, it is often a relatively expensive portion thereof. But if a less expensive, less accurate driver is used, CKE may not switch fast enough between logic 1 and logic 0; consequently, the memory device may interpret the self-refresh instruction of FIG. 2 as an auto-refresh instruction. This problem can be avoided in a newer version of a memory device by merely redefining the self-refresh instruction, and designing the newer version to be compatible with the redefined instruction. But older versions of the memory device that are still in use may be incompatible with the redefined instruction. Of course, the system can wait until CKE fully transitions to logic 0 before issuing a conventional self-refresh command. But this will significantly and unnecessarily increase the time it takes to initiate a self-refresh mode in the newer versions of the memory device.

SUMMARY OF THE INVENTION

In accordance with one aspect of the present invention, an integrated circuit includes address, data, and command busses, a bank of memory cells arranged in rows, an address decoder coupled to the address bus and memory bank, a read/write circuit coupled to the address decoder and the memory bank, a data input/output circuit coupled to the data bus and read/write circuit, and a control circuit coupled to the command bus, address decoder, read/write circuit, and data input/output circuit. The control circuit implements a self refresh of the memory bank when it receives on the command bus a clock signal having clock edges, a refresh command at a first clock edge, and a column command at a second clock edge that occurs a predetermined number of clock edges after the first clock edge.

Thus, one embodiment of the present invention allows a system to include a low-cost CKE driver and both newer and older versions of the same integrated circuit.

DETAILED DESCRIPTION OF THE INVENTION

Figure 1:
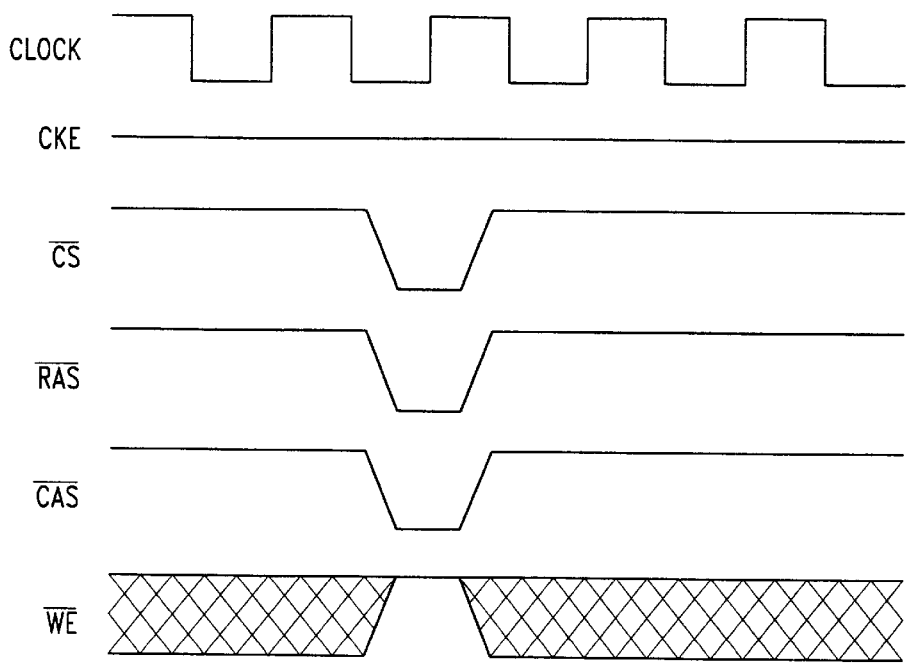
FIG. 1 is a timing diagram of a conventional auto-refresh instruction.
Figure 2:
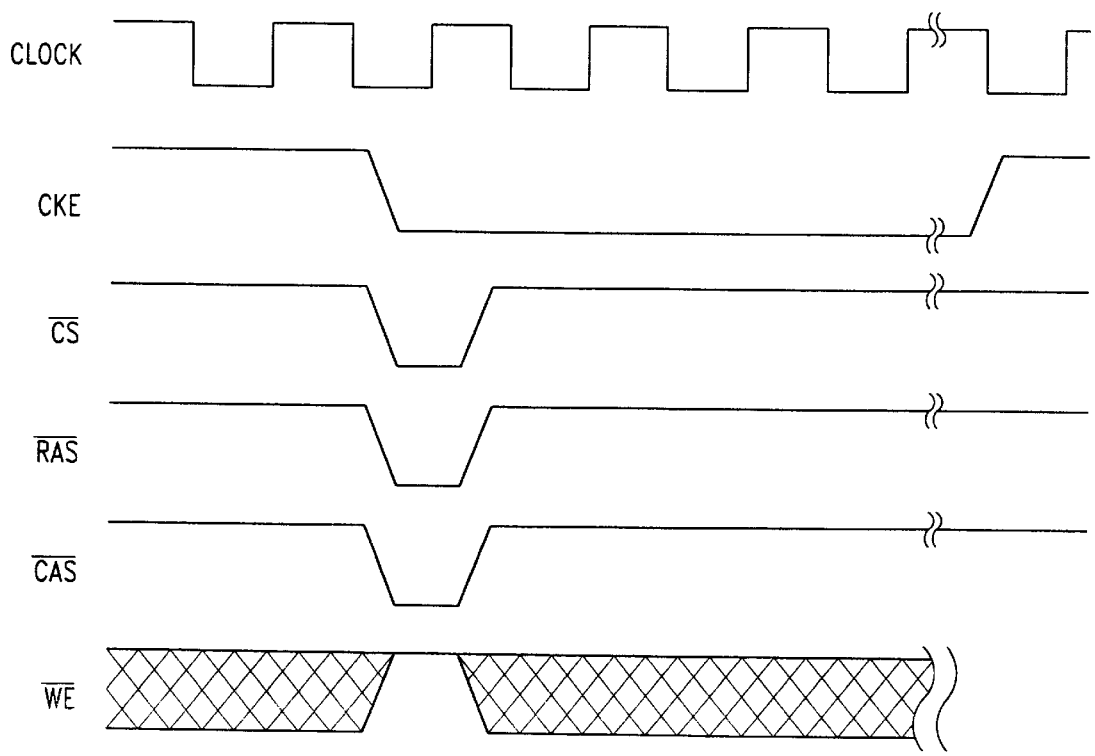
FIG. 2 is a timing diagram of a conventional self-refresh instruction.
Figure 3:
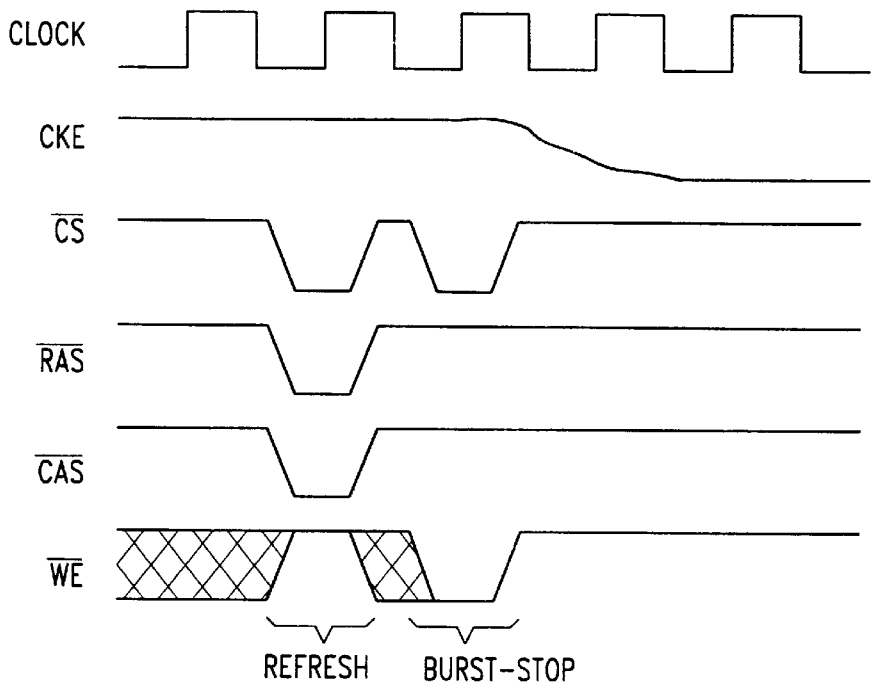
FIG. 3 is a timing diagram of a first embodiment of a self-refresh instruction according to the present invention.

FIG. 3 is a timing diagram of a first embodiment of a self-refresh instruction according to the invention. Generally, the instruction includes the conventional refresh command of FIGS. 1 and 2 followed within the next few clock periods by a conventional column command. Column commands typically include read, write, or related commands. The instruction also includes CKE equal to logic 1, although as discussed below, CKE can equal logic 0, or equal either logic 1 or logic 0 (a "don't care" condition). New versions of memory devices can include a circuit that recognizes such a self-refresh instruction. There are many types of such circuits that can be designed by one of ordinary skill in the art. Therefore, for clarity such circuits are not further discussed here.

The self-refresh instruction of FIG. 3 includes a conventional column command following the refresh command because existing versions of memory devices typically neither recognize nor respond to a column command until a predetermined minimum number of clock cycles after receiving a row command, such as the refresh command. A row command is typically any command that causes one or more of the word lines in the memory device to fire. Thus, as long as the column command follows the refresh command within this minimum number of clock cycles, then an existing memory device will ignore the column command as a separate command. For example, this predetermined number may range between 1 and 4 clock cycles. Of course, because the new self-refresh instruction may include CKE equal to logic 1, as discussed above, the existing memory device may recognize the new self-refresh instruction as a conventional auto-refresh instruction. But as discussed below, this is not a problem.

The preferred column command for the new self-refresh instruction is a conventional burst-stop command, which is shown following the refresh command in FIG. 3 and includes $\overline{CS}$ and $\overline{WE}$ equal logic 0 and $\overline{RAS}$ and $\overline{CAS}$ equal logic 1. Generally, a burst-stop command halts a previously initiated sequential reading of multiple words of data from a single row of memory cells. Furthermore, when $\overline{CAS}$ equals an inactive logic level, here logic 1, the write circuitry of the memory device is disabled, and thus no data can be written to the memory device. A specific example of a burst-stop command is described in Micron's 1995 DRAM Data Book for the MT41 device. Therefore, because $\overline{CAS}$ equals an inactive logic 1 for the burst-stop command, even if an older memory device recognizes the burst-stop command as a separate command, no writing of data occurs, and thus the stored data is not corrupted.

During operation of a memory system that includes only memory devices that recognize the new self-refresh instruction of FIG. 3, the system need only generate this self-refresh instruction to initiate a self-refresh mode in these memory devices.

Figure 3A:
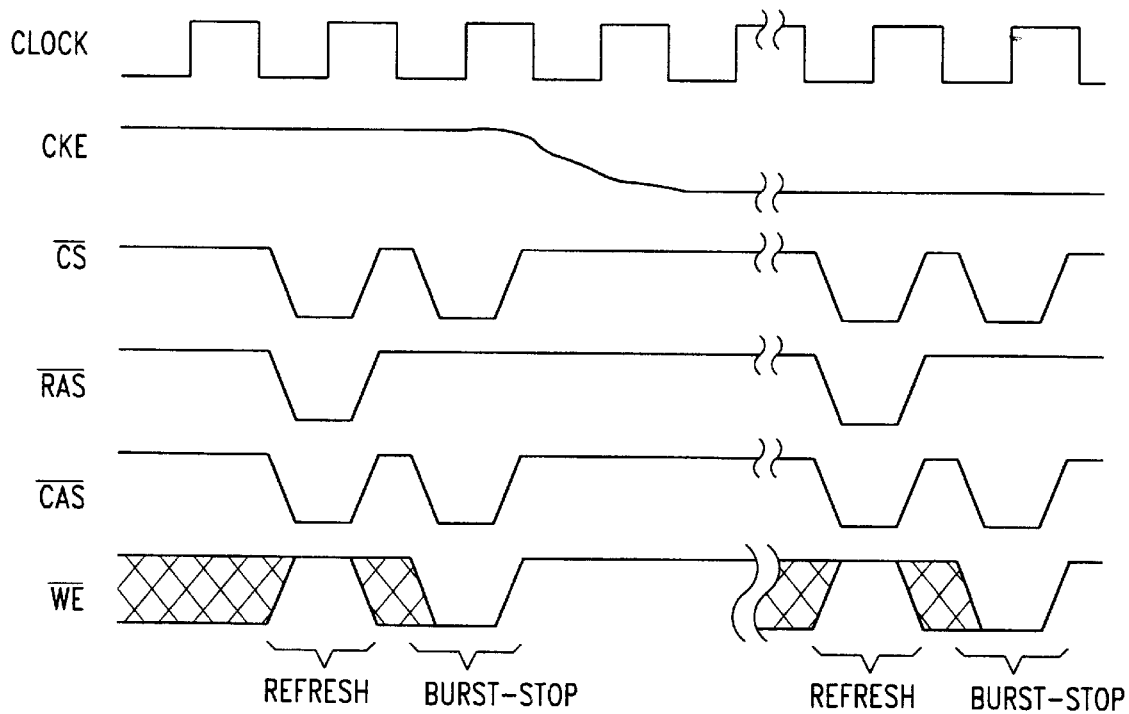
FIG. 3a is a timing diagram of a series of self-refresh instructions according to the invention for systems that include both older and newer devices.

Referring to FIG. 3a, during operation of a system that includes both newer memory devices that recognize the new self-refresh instruction of FIG. 3 and older memory devices that recognize only the conventional self-refresh instruction of FIG. 2, the system generates a first new self-refresh instruction to initiate a self-refresh mode in the newer memory devices. Because the burst-stop command follows the refresh command within the predetermined number of clock cycles as described above, the older memory devices ignore the burst-stop command, interpret the new self-refresh instruction as the conventional auto-refresh instruction of FIG. 1, and implement a conventional auto-refresh. The older memory devices interpret the new self-refresh instruction as a conventional auto-refresh instruction because CKE is still a logic 1. CKE is still a logic 1 because although the system has instructed CKE to transition to logic 0, if an inexpensive CKE driver is used as discussed above, then CKE may not fully transition to a logic 0 until after the new self-refresh instruction, as shown in FIG. 3a. Of course, if CKE does transition to logic 0 fast enough, the older memory devices will recognize the refresh-command portion of the new self-refresh instruction as the conventional self-refresh instruction of FIG. 2, and implement a self-refresh mode.

Still referring to FIG. 3a, the system then waits a predetermined amount of time that is sufficient for both CKE to fully transition to logic 0 and for the older memory devices to finish implementing the auto-refresh. Depending upon the characteristics of the older memory devices, this predetermined time may range from 90 to several hundred nanoseconds. After waiting this predetermined time, the system generates a second new self-refresh instruction. Because CKE now equals logic 0, the older memory devices interpret the refresh-command portion of this instruction as the conventional self-refresh instruction of FIG. 2, and thus enter a self-refresh mode. Alternatively, because the older memory devices ignore the burst-stop command anyway, and because the newer memory devices are already in self-refresh mode and ignore any external signals as long as CKE equals logic 0, the system may generate the conventional self-refresh command of FIG. 2 in place of the second new self-refresh instruction of FIG. 3a. If, as discussed above, CKE does transition to logic 0 fast enough so that the older memory devices implement a self-refresh mode in response to the first new self-refresh instruction, then they, like the newer memory devices, will ignore the second new self-refresh command because CKE remains at logic 0. Neither the newer nor the older memory circuits will exit the self-refresh mode until CKE transitions back to logic 1.

Therefore, the new self-refresh instruction as implemented in FIG. 3a is compatible with a system that has both older and newer memory devices, whether the system has a fast or a slow CKE driver. Furthermore, the new self-refresh instruction can be used in systems that include only newer memory devices, whether the system includes a fast or slow CKE driver. When used in the latter system, the new self-refresh instruction increases the speed of the system by being able to initiate a self-refresh mode in the newer memory devices before CKE fully transitions to logic 0.

Figure 4:
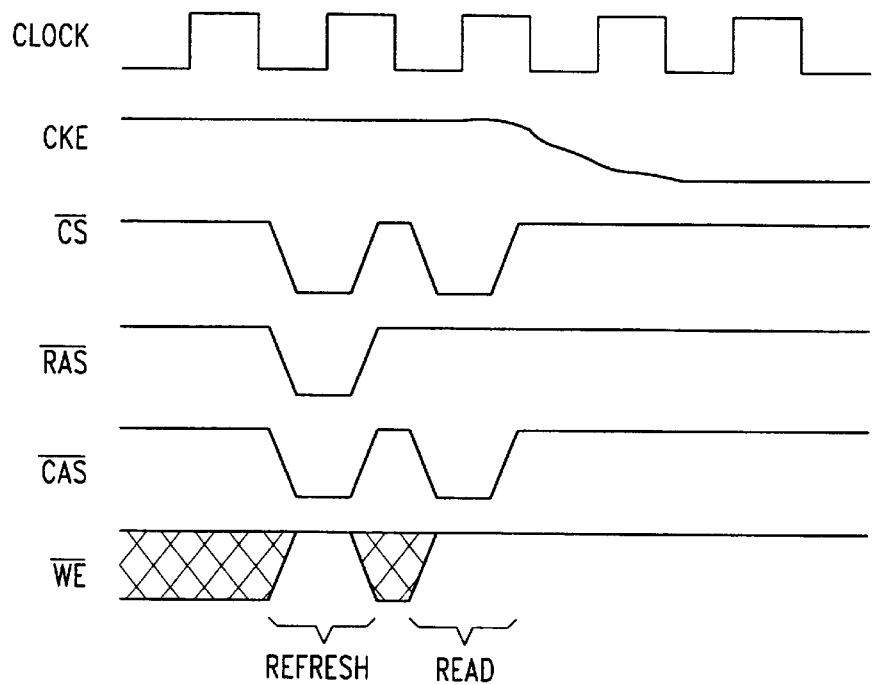
FIG. 4 is a timing diagram of a second embodiment of a self-refresh instruction according to the present invention.

FIG. 4 is a timing diagram of a second embodiment of a self-refresh instruction according to the invention. Like the first embodiment of the self-refresh instruction of FIG. 3, the second self-refresh instruction includes a conventional refresh command. But instead of the burst-stop command, the second self-refresh instruction includes a conventional read command that follows the refresh command within the predetermined number of clock cycles as described above. Generally, a read command is a type of column command that instructs a memory device to provide data from an addressed memory location to a data bus for reading by an external circuit. Of course, the read command is ignored here as described above. Also as described above, the second embodiment of the self-refresh instruction can be defined to allow CKE to have a "don't care" state. Furthermore, although $\overline{CAS}$ equals an active logic 0 for the read command, $\overline{WE}$ equals an inactive logic 1. Generally, when $\overline{WE}$ equals an inactive logic level, the write circuitry of the memory device is disabled, and thus no data can be written to the memory device. Therefore, even if an older version of a memory device recognizes and executes the read command, no data is written to the memory, and the stored data is not corrupted.

Figure 5:
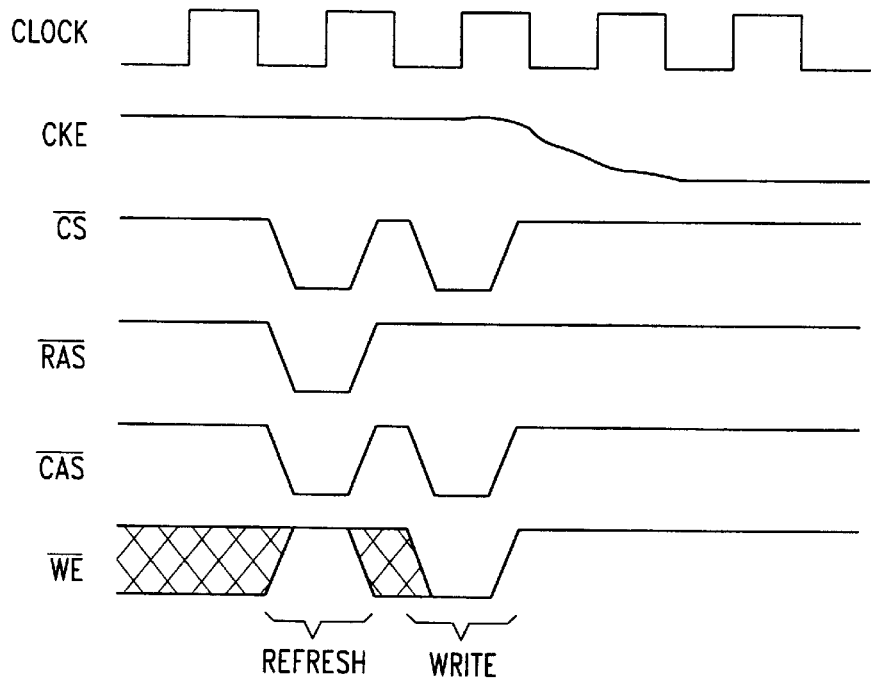
FIG. 5 is a timing diagram of a third embodiment of a self-refresh instruction according to the present invention.

FIG. 5 is a timing diagram of a third embodiment of the self-refresh instruction according to the invention. The difference between this embodiment and the second embodiment of FIG. 4 is that the refresh command is followed by a conventional write command instead of a read command. A write command is a column command that instructs the memory device to receive data from an external source and to store the data in an addressed memory location. Thus, unlike the first and second embodiments of the new self-refresh instruction, if an older memory device recognizes the write command, then data may be corrupted. Therefore, the first and second embodiments of the new self-refresh instruction are preferred over the third embodiment. Again, the third embodiment of the self-refresh instruction can be defined with CKE having a "don't care" state.

Figure 6:
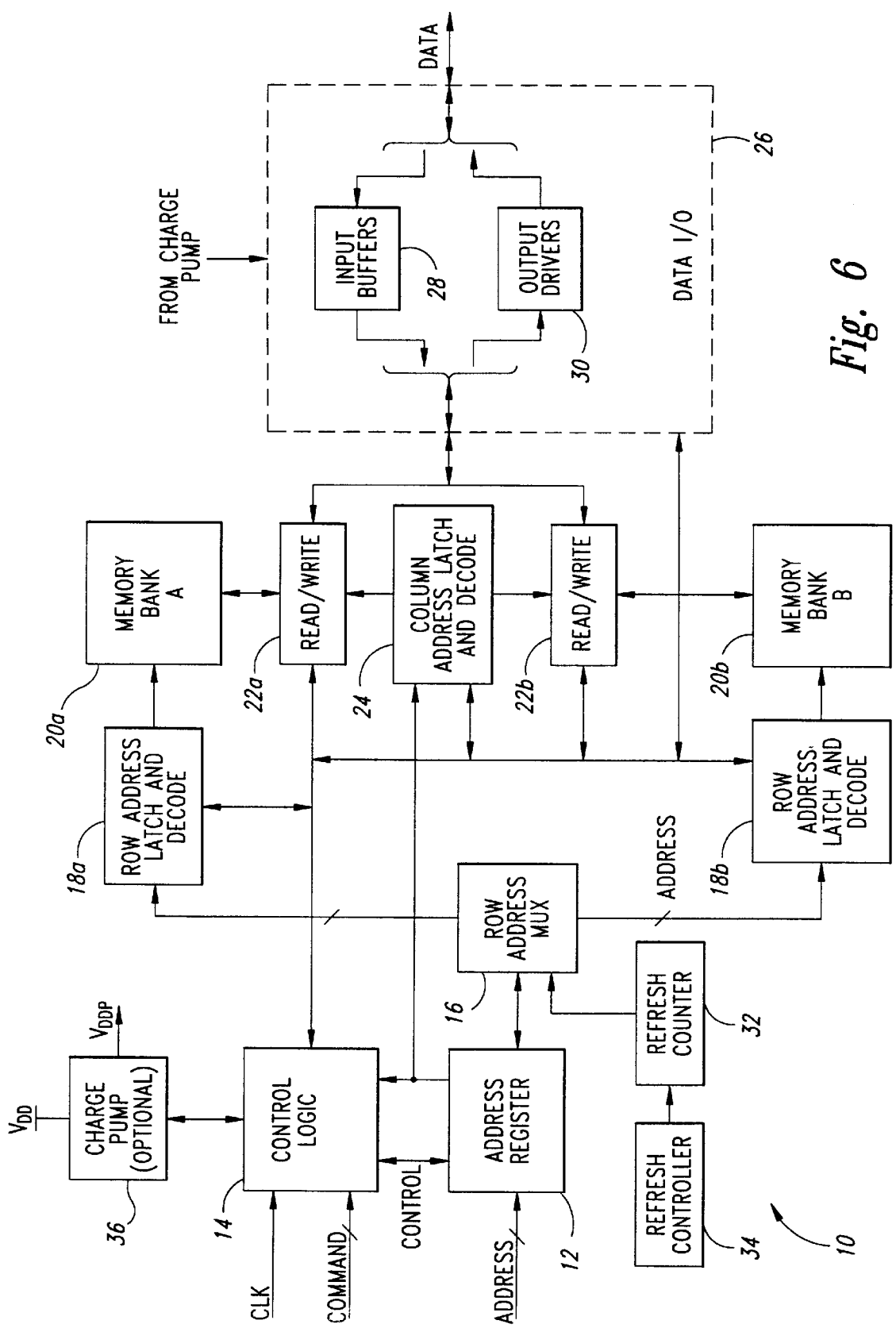
FIG. 6 is a block diagram of a memory device that accepts a self-refresh instruction according to the invention.

FIG. 6 is a block diagram of a memory device 10 that recognizes a self-refresh instruction according to a preferred embodiment of the invention. In one embodiment of the invention, the memory device 10 is a synchronous dynamic random access memory (SDRAM), although other types of memories and integrated circuits other than memories, such as processors, may be designed to recognize the self-refresh instruction according to the invention.

The memory device 10 includes an address register 12, which receives an address from an address bus ADDRESS. Control logic circuit 14 receives a clock (CLK) signal, receives the signals CKE, $\overline{CS}$, $\overline{RAS}$, $\overline{CAS}$, and $\overline{WE}$ from the COMMAND bus, and communicates with the other elements of the memory device 10. A row-address multiplexer 16 receives the address signal from the address register 12, and provides the row address to the row-address latch-and-decode circuits 18a and 18b for either a first memory bank 20a or a second memory bank 20b, respectively. During read and write cycles, the row-address latch-and-decode circuits 18a and 18b activate the word lines of the addressed rows of memory cells in the memory banks 20a and 20b, respectively. Read/write circuits 22a and 22b read data from the addressed memory cells in the memory banks 20a and 20b, respectively, during a read cycle, and write data to the addressed memory cells during a write cycle. A column-address latch-and-decode circuit 24 receives the address from the address register 12 and provides the column address of the selected memory cells to the read/write circuits 22a and 22b. For clarity, the address register 12, the row-address multiplexer 16, the row-address latch-and-decode circuits 18a and 18b, and the column-address latch-and-decode circuit 24 can be collectively referred to as the address decoder.

A data input/output (I/O) circuit 26 includes a plurality of input buffers 28. During a write cycle, the buffers 28 receive and store data from the DATA bus, and the read/write circuits 22a and 22b provide this stored data to the memory banks 20a and 20b, respectively. The data I/O circuit 26 also includes a plurality of output drivers 30. During a read cycle, the read/write circuits 22a and 22b provide data from the memory banks 20a and 20b, respectively, to the drivers 30, which in turn provide this data to the DATA bus.

A refresh counter 32 stores the address of the row of memory cells to be refreshed either in response to an auto-refresh instruction or when the memory device 10 is operating in a self-refresh mode. After the row is refreshed, a refresh controller 34 updates the address in the refresh counter 32, typically by either incrementing or decrementing the contents of the refresh counter 32. Although shown separately, the refresh controller 34 may be part of the control logic 14 in other embodiments of the memory device 10.

The memory device 10 may also include an optional charge pump 36, which steps up the power-supply voltage $V_{DD}$ to a voltage $V_{DDP}$. In one embodiment of the invention, the pump 36 generates $V_{PPD}$ approximately 1–1.5 V higher than $V_{DD}$. The memory device 10 may also use $V_{PPD}$ to overdrive selected internal transistors in a conventional manner.

In operation, if the memory device 10 is an SDRAM, then most of the input signals and output signals, as well as many of the internal signals, are synchronized to the CLK signal. Thus, the relative timing of these signals often must meet stringent specifications in order that the SDRAM operate properly and at its rated speed. As discussed above in conjunction with FIG. 3, an exception to this is the signal CKE. When the memory device 10 receives a self-refresh instruction according to the invention, the control logic 14 controls the refresh controller 34, the refresh counter 32, and the read/write circuitry 22a and 22b to implement a conventional self-refresh mode. During this mode of operation, the rows of the memory banks 20a and 20b are continually refreshed using internally generated signals—as opposed to externally provided signals—as long as CKE equals a specified logic state, for example logic 0. When CKE returns to the other logic state, for example logic 1, the memory device 10 first completes any uncompleted self-refresh cycles, and then is ready to receive and execute external instructions.

Figure 7:
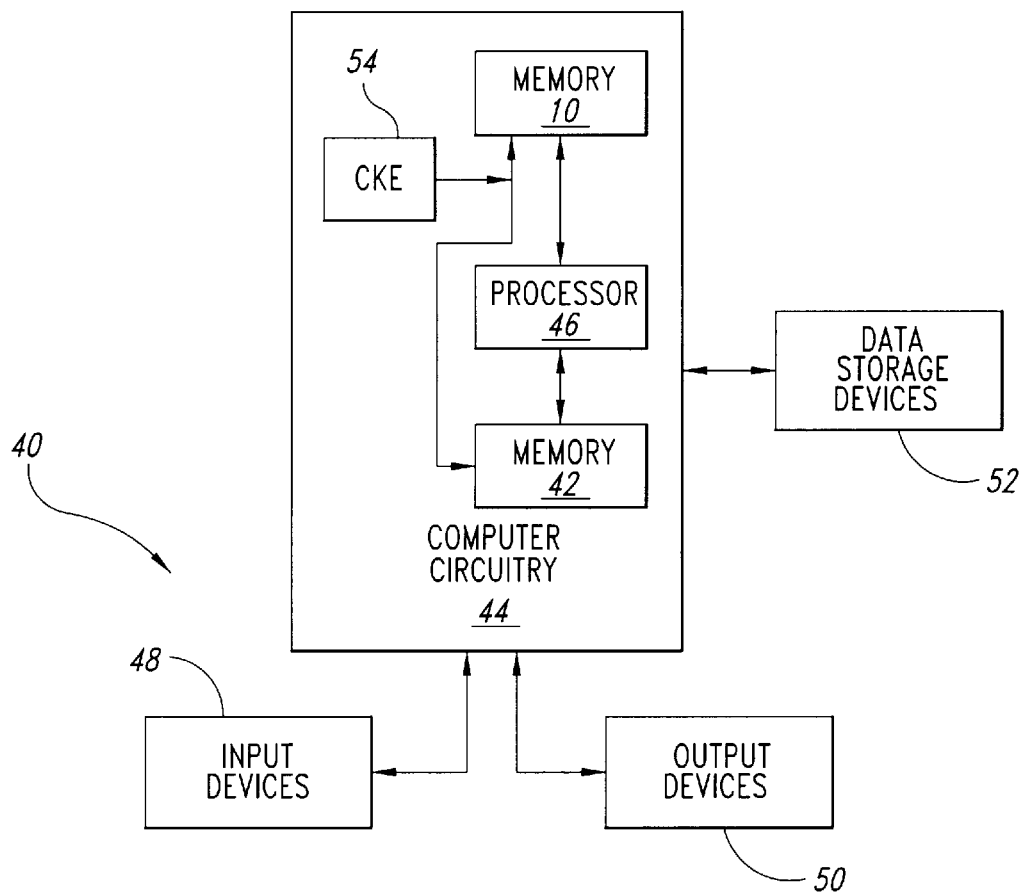
FIG. 7 is a block diagram of a computer system that incorporates the memory device of FIG. 6.

FIG. 7 is a block diagram of an electronic system 40, such as a computer system, that includes at least one newer integrated circuit, such as the memory 10, that recognizes a self-refresh instruction according to the invention, and that includes at least one older integrated circuit, such as a memory 42, that recognizes a conventional self-refresh instruction. The electronic system 40 also includes computer circuitry 44 for performing computer functions such as executing software to perform desired calculations and tasks. The circuitry 44 typically includes a processor 46 and the memory devices 10 and 42, which are coupled to the processor 46. One or more input devices 48, such as a keyboard or a mouse, are coupled to the computer circuitry 44 and allow an operator (not shown) to manually input data thereto. One or more output devices 50 are coupled to the computer circuitry 44 to provide to the operator data generated by the computer circuitry 44. Examples of such output devices 50 include a printer and a video display unit. One or more data-storage devices 52 are coupled to the computer circuitry 44 to store data on or retrieve data from external storage media (not shown). Examples of the storage devices 52 and the corresponding storage media include drives that accept hard and floppy disks, tape cassettes, and compact disk read-only memories (CD-ROMs). Typically, the computer circuitry 44 includes address data and command buses and a clock line that are respectively coupled to the ADDRESS, DATA, and COMMAND buses and the CLK line of the memory devices 10 and 42. The system 40 also includes a low-cost CKE driver that 54 does not transfer CKE from logic 1 to logic 0 fast enough to use only a single, conventional self-refresh instruction.

In operation, to initiate a self-refresh mode in the memory 10, the memory 42, and any other circuits, such as processor 46, that support such a mode, the system 40 first generates a self-refresh instruction according to the preferred embodiment of the invention, and then generates a conventional self-refresh instruction. For example, as discussed above in conjunction with FIG. 3a, the system 40 may first generate a self-refresh instruction according to one of embodiments shown in FIGS. 3–5 to initiate a self-refresh mode in the memory 10. Next, the computer circuitry 44 waits a predetermined length of time that is sufficient to ensure that CKE has transitioned to the proper logic level, for example logic 0. This time is also sufficient for the memory device 42 to finish executing an instruction that it may have implemented in response to the new self-refresh instruction. After the elapse of this predetermined time, the computer circuitry 44 then issues a second self-refresh instruction to initiate a self-refresh mode in the memory 42. Therefore, this sequence of self-refresh instructions—one for newer integrated circuits that recognize the self-refresh command according to the invention, and another for older integrated circuits that recognize only a conventional self-refresh instruction—ensures that all of the circuits that support a self-refresh mode will properly enter and execute such a mode. The design of circuits that can generate and recognize the self-refresh instruction according to the invention will be evident to those of ordinary skill in the art. Therefore, the structures of such circuits are not discussed here.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An integrated circuit, comprising:
   address, data, and command busses;
   a bank of memory cells arranged in rows;
   an address decoder coupled to said address bus and said memory bank;
   a read/write circuit coupled to said address decoder and said memory bank;
   a data input/output circuit coupled to said data bus and said read/write circuit; and
   a control circuit coupled to said command bus, said address decoder, said read/write circuit, and said data input/output circuit, said control circuit operable to implement a self refresh of said memory bank when said control circuit receives on said command bus a clock signal having clock edges, a refresh command at a first one of said clock edges, and a column command at a second one of said clock edges that occurs within a predetermined number of said clock edges after said first clock edge such that said control circuit recognizes a combination of said refresh and column commands as a self-refresh instruction.

2. The integrated circuit of claim 1 wherein said control circuit further receives a first signal having a first logic level at said first clock edge.

3. The integrated circuit of claim 1 wherein:
   said refresh command comprises a row command; and
   said control circuit is operable to implement said self refresh when said control circuit receives said column command before it receives a row command other than said refresh command.

4. The integrated circuit of claim 1 wherein said column command comprises a burst terminate command.

5. The integrated circuit of claim 1 wherein said column command comprises a read command.

6. The integrated circuit of claim 1 wherein said column command comprises a write command.

7. The integrated circuit of claim 1, further comprising:
   a refresh counter coupled to said address decoder and to said control circuit, said counter operable to store an address of a row of memory cells that are to be refreshed during said self refresh of said memory bank; and
   said control circuit operable to update said counter after said memory cells of said row are refreshed.

8. A computer system, comprising:
   a data input device;
   a data output device; and
   computing circuitry coupled to said data input and output devices, said computing circuitry including a memory device that includes,
   address, data, and command busses,
   a bank of memory cells arranged in rows,
   an address decoder coupled to said address bus and said memory bank,
   a read/write circuit coupled to said address decoder and said memory bank,
   a data input/output circuit coupled to said data bus and said read/write circuit, and
   a control circuit coupled to said command bus, said address decoder, said read/write circuit, and said data input/output circuit, said control circuit operable to implement a self refresh of said memory bank when said control circuit receives on said command bus a clock signal having clock edges, a refresh command at a first one of said clock edges, and a column command at a second one of said clock edges that occurs within a predetermined number of clock edges after said first clock edge such that said control circuit recognizes a combination of said refresh and column commands as a self-refresh instruction.

9. The memory device of claim 8 wherein said column command comprises a burst terminate command.

10. The memory device of claim 8, further comprising:
    a refresh counter coupled to said address decoder and to said control circuit, said counter operable to store an address of a row of memory cells that are to be refreshed during said self refresh of said memory bank; and
    said control circuit operable to update said counter after said memory cells of said row are refreshed.

11. An electronic system, comprising:
    a data input device;
    a data output device;
    computing circuitry coupled to said data input and output devices, said computing circuitry including a first and second memory devices that each respectively include,
    address, data, and command busses,
    a bank of memory cells arranged in rows,
    an address decoder coupled to said address bus and said memory bank,
    a read/write circuit coupled to said address decoder and said memory bank,
    a data input/output circuit coupled to said data bus and said read/write circuit, and
    a control circuit coupled to said command bus, said address decoder, said read/write circuit, and said data input/output circuit, said control circuit operable to implement a self-refresh mode of operation in response to a first or second self-refresh instruction, respectively;

said computing circuitry operable to generate on said command busses of said first and second memory devices a first refresh command, a column command after said first refresh command without any intervening row command between said first refresh and column commands, a first signal having a first logic level after said column command, and a second refresh command after said column command and when said first signal equals said first logic level;

said control circuit of said first memory device operable to interpret a combination of said first refresh command and said column command as said first self-refresh instruction; and said control circuit of said second memory device operable to interpret a combination of said second refresh command and said first logic level of said first signal as said second self-refresh instruction.

12. The electronic system of claim 11 wherein said column command comprises a burst-stop command.

13. The electronic system of claim 11 wherein said first and second memory devices each comprise:

a refresh counter coupled to said address decoder and to said control circuit, said counter operable to store an address of a row of memory cells that are to be refreshed during said self-refresh mode; and said control circuit operable to update said counter after said memory cells of said row are refreshed.

14. The electronic system of claim 11 wherein said computing circuitry further generates on said command busses said first signal having a second logic level before said column command.

15. An electronic system, comprising:

a data input device;

a data output device;

computing circuitry coupled to said data input and output devices, said computing circuitry including a first and second memory devices that each respectively include, address, data, and command busses, a bank of memory cells arranged in rows, an address decoder coupled to said address bus and said memory bank, a read/write circuit coupled to said address decoder and said memory bank, a data input/output circuit coupled to said data bus and said read/write circuit, and a control circuit coupled to said command bus, said address decoder, said read/write circuit, and said data input/output circuit, said control circuit operable to implement a self-refresh mode of operation in response to a first or second self-refresh instruction, respectively;

said computing circuit operable to generate on said command busses of said first and second memory devices, a clock signal having clock edges, a first refresh command at a first one of said clock edges, a column command at a second one of said clock edges that occurs within a predetermined number of clock edges from said first clock edge without any intervening row command between said first refresh command and said column command, a first signal having a first logic level after generating said column command, and a second refresh command at a third one of said clock edges that occurs after said second clock edge and when said first signal equals said first logic level;

said control circuit of said first memory device operable to interpret a combination of said first refresh command and said column command as said first self-refresh instruction; and said control circuit of said second memory device operable to interpret a combination of said second refresh command and said first logic level of said first signal as said second self-refresh instruction.

16. The electronic system of claim 15 wherein said first and second refresh commands are the same commands.

17. The electronic system of claim 15 wherein said computing circuit is further operable to generate on said command busses said first signal having a second logic level at said first clock edge.

18. An electronic system, comprising:

a data input device;

a data output device; and computing circuitry coupled to said data input and output devices, said computing circuitry including a first and second memory devices that each respectively include, address, data, and command busses, a bank of memory cells arranged in rows, an address decoder coupled to said address bus and said memory bank, a read/write circuit coupled to said address decoder and said memory bank, a data input/output circuit coupled to said data bus and said read/write circuit, and a control circuit coupled to said command bus, said address decoder, said read/write circuit, and said data input/output circuit, said control circuit of said first memory device operable to implement a first mode of operation in response to a first instruction, said control circuit of said second memory device operable to implement a second mode of operation in response to a second instruction that includes a first logic level of a signal;

said computing circuit operable to generate on said command busses of said first and second memory devices, said first instruction, said signal beginning to transition from a second logic level to said first logic level during said generation of said first instruction, said signal substantially equaling said second logic level during generation of said first instruction, and said second instruction after said first instruction and when said signal equals said first logic level.

19. The electronic system of claim 18 wherein said signal comprises a clock-enable signal.

20. The electronic system of claim 18 wherein said first and second instructions comprise substantially identical self-refresh instructions.

21. Method for initiating a self-refresh cycle in a memory circuit, the method comprising:

providing a clock signal to said memory circuit;

providing a refresh command to said memory circuit during a first clock period; and providing a column command to said memory circuit during a second clock period that is within a predetermined number of clock periods after said first clock period such that said memory circuit recognizes a combination of said refresh and column commands as a self-refresh instruction.

22. The method of claim 21 wherein said providing a refresh command comprises:

providing a chip-select signal having a first logic level;

providing a row-address strobe having said first logic level;

providing a column-address strobe having said first logic level; and providing a write-enable signal having a second logic level.

23. The method of claim 21 wherein said providing a column command comprises providing a burst-stop command.

24. The method of claim 21 wherein said providing a column command comprises:

providing a chip-select signal having a first logic level;

providing a row-address strobe having a second logic level;

providing a column-address strobe having said second logic level; and providing said write-enable signal having said first logic level.

25. The method of claim 21 wherein said providing a column command comprises providing a read command.

26. The method of claim 21 wherein said providing a column command comprises:

providing a chip-select signal having a first logic level;

providing a row-address strobe having a second logic level;

providing a column-address strobe having said first logic level; and providing said write-enable signal having said second logic level.

27. The method of claim 21 wherein said providing a column command comprises providing a write command.

28. The method of claim 21 wherein said providing a column command comprises:

providing a chip-select signal having a first logic level;

providing a row-address strobe having a second logic level;

providing a column-address strobe having said first logic level; and providing said write-enable signal having said first logic level.

29. The method of claim 21, further comprising providing to said memory circuit a first signal having a first logic level during said first clock period.

30. The method of claim 29 wherein said first signal is a clock-enable signal.

31. The method of claim 29 wherein said providing a first signal comprises providing said first signal having said first logic level during said second clock period.

32. The method of claim 21 wherein:

said refresh command comprises a row command; and said providing a column command comprises providing said column command to said memory circuit before providing a row command other than said refresh command to said memory circuit.

33. Method for initiating a memory self-refresh mode in integrated circuits that compose an electronic system, the method comprising:

providing a first refresh command to said circuits;

providing a column command to said circuits as the next command after said refresh command;

providing a first signal having a first logic level; and providing a second refresh command to said circuits when said first signal equals said first logic level.

34. The method of claim 33 wherein said first signal is a clock-enable signal.

35. The method of claim 33 wherein said first refresh command is the same as said second refresh command.

36. The method of claim 33 wherein said providing a first refresh command and said providing a second refresh command each comprise:

providing a chip-select signal having said first logic level;

providing a row-address strobe having said first logic level;

providing a column-address strobe having said first logic level; and providing a write-enable signal having a second logic level.

37. The method of claim 33 wherein said providing a column command comprises providing a burst-stop command.

38. The method of claim 33 wherein said providing a column command comprises:

providing a chip-select signal having said first logic level;

providing a row-address strobe having a second logic level;

providing a column-address strobe having said second logic level; and providing said write-enable signal having said first logic level.

39. The method of claim 33 wherein said providing a column command comprises providing a read command.

40. The method of claim 33 wherein said providing a column command comprises:

providing a chip-select signal having said first logic level;

providing a row-address strobe having a second logic level;

providing a column-address strobe having said first logic level; and providing said write-enable signal having said second logic level.

41. The method of claim 33 wherein said providing a column command comprises providing a write command.

42. The method of claim 33 wherein said providing a column command comprises:

providing a chip-select signal having said first logic level;

providing a row-address strobe having a second logic level;

providing a column-address strobe having said first logic level; and providing said write-enable signal having said first logic level.

43. The method of claim 33, further comprising providing said first signal having a second logic level before said providing a first refresh command.

44. Method for initiating a memory self-refresh cycle in interconnected integrated circuits, the method comprising:

providing a clock signal having clock edges;

providing to said circuits a first refresh command at a first clock edge;

providing to said circuits a column command at a second clock edge that occurs a predetermined number of clock edges from said first clock edge;

providing a first signal having a first logic level after providing said column command; and providing to said circuits a second refresh command at a third clock edge that occurs after said second clock edge and when said first signal equals said first logic level.

45. The method of claim 44 wherein said first signal is a clock-enable signal.

46. The method of claim 44 wherein said first refresh command is the same as said second refresh command.

47. The method of claim 44 wherein said providing a column command comprises providing a burst-stop command.

48. The method of claim 44, further comprising providing said first signal having a second logic level at said first and second clock edges.

49. A method, comprising:

issuing a sequence of commands representing an instruction to a first set of devices in an electronic system, said issuing including causing a signal to begin transitioning from a first logic level to a second logic level, said signal remaining substantially at said first logic level during said issuing; and issuing a command that is separate from said sequence of commands to a second set of devices in said electronic system after issuing said sequence of commands and after said signal transitions to said second logic level, a combination of said command and said second logic level of said signal representing said instruction to said second set of devices.

50. The method of claim 49 wherein said signal comprises a clock-enable signal.

51. The method of claim 49 wherein said instruction comprises a self-refresh instruction.

* * * * *

UNITED STATES PATENT AND TRADEMARK OFFICE
CERTIFICATE OF CORRECTION

PATENT NO. : 5,818,777
DATED : October 6, 1998
INVENTOR(S) : Seyyedy

It is certified that error appears in the above-identified patent and that said Letters Patent is hereby corrected as shown below:

| | | |
|---|---|---|
| Column 6, line 12 | "$V_{PPD}$" | -- $V_{DDP}$ -- |
| Column 6, line 13 | "$V_{PPD}$" | -- $V_{DDP}$ -- |
| Column 6, line 63 | "CKE driver that 54" | -- CKE driver 54 that -- |

Signed and Sealed this

Twenty-ninth Day of May, 2001

*Attest:*

NICHOLAS P. GODICI

*Attesting Officer*   *Acting Director of the United States Patent and Trademark Office*